US010262967B2

(12) United States Patent
Hwang et al.

(10) Patent No.: US 10,262,967 B2
(45) Date of Patent: Apr. 16, 2019

(54) SEMICONDUCTOR PACKAGES

(71) Applicant: Samsung Electronics Co., Ltd., Suwon-si, Gyeonggi-do (KR)

(72) Inventors: Tae-Joo Hwang, Yongin-si (KR); Eun-Seok Song, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/868,411

(22) Filed: Jan. 11, 2018

(65) Prior Publication Data

US 2019/0057949 A1 Feb. 21, 2019

(30) Foreign Application Priority Data

Aug. 16, 2017 (KR) .................. 10-2017-0103698

(51) Int. Cl.
*H01L 23/485* (2006.01)
*H01L 21/02* (2006.01)
(Continued)

(52) U.S. Cl.
CPC .......... *H01L 24/24* (2013.01); *H01L 23/3121* (2013.01); *H01L 23/5223* (2013.01); *H01L 24/02* (2013.01); *H01L 24/19* (2013.01); *H01L 24/25* (2013.01); *H01L 25/10* (2013.01); *H01L 28/90* (2013.01); *H01L 2224/0236* (2013.01); *H01L 2224/02311* (2013.01); *H01L 2224/02331* (2013.01); *H01L 2224/02379* (2013.01); *H01L 2224/02381* (2013.01); *H01L 2224/24195* (2013.01); *H01L 2224/25171* (2013.01);
(Continued)

(58) Field of Classification Search
CPC . H01L 23/3121; H01L 23/5223; H01L 24/24; H01L 24/25; H01L 24/19; H01L 24/02; H01L 28/90; H01L 25/10
USPC ....... 257/532, 534, 535, 660, 686, 777, 296, 257/E23.062, E23.114, E23.142, E23.144, 257/E21.008, E21.011, E21.016, E21.019, 257/E21.241, E29.342; 361/301.4, 502, 361/503, 62; 438/381, 387, 393, 396
See application file for complete search history.

(56) References Cited

U.S. PATENT DOCUMENTS 7,126,207 B2 10/2006 Mosley et al.
7,365,395 B2 4/2008 Stumbo et al.
(Continued)

FOREIGN PATENT DOCUMENTS

JP 09-008427 1/1997
JP 4293437 4/2009
(Continued)

*Primary Examiner* — Dao H Nguyen
(74) *Attorney, Agent, or Firm* — Sughrue Mion, PLLC

(57) ABSTRACT

A semiconductor package can include a mold substrate having opposite first and second surfaces where a semiconductor chip can be embedded inside the mold substrate. The semiconductor chip can include chip pads where a redistribution layer can be on the first surface of the mold substrate, and the redistribution layer can include redistribution lines therein electrically connected to the chip pads and can include a capacitor redistribution line. A capacitor can include a first electrode including a plurality of conductive pillars connected to the capacitor redistribution line. A dielectric layer can be on the first electrode and a second electrode can be on the dielectric layer.

14 Claims, 29 Drawing Sheets

(51) Int. Cl.
  *H01L 25/10* (2006.01)
  *H01L 23/00* (2006.01)
  *H01L 23/522* (2006.01)
  *H01L 49/02* (2006.01)
  *H01L 23/31* (2006.01)

(52) U.S. Cl.
  CPC ............... *H01L 2225/1035* (2013.01); *H01L 2225/1041* (2013.01); *H01L 2225/1058* (2013.01); *H01L 2924/19011* (2013.01); *H01L 2924/19041* (2013.01); *H01L 2924/19105* (2013.01)

(56) References Cited

U.S. PATENT DOCUMENTS

| | | | |
|---|---|---|---|
| 7,428,138 B2 | 9/2008 | Mosley | |
| 7,710,709 B2 | 5/2010 | Min et al. | |
| 7,952,187 B2 | 5/2011 | Kapusta et al. | |
| 8,742,541 B2* | 6/2014 | Mohammed | H01G 4/06 257/298 |
| 9,165,793 B1 | 10/2015 | Wang et al. | |
| 9,472,425 B2 | 10/2016 | Song et al. | |
| 9,548,266 B2 | 1/2017 | Ajuria et al. | |
| 9,704,836 B2* | 7/2017 | Lin | H01L 23/49822 |
| 2005/0266652 A1* | 12/2005 | Chudzik | H01L 23/5223 438/387 |
| 2007/0242440 A1* | 10/2007 | Sugaya | H01L 23/3128 361/762 |
| 2008/0131658 A1 | 6/2008 | Wakharkar et al. | |
| 2011/0186978 A1* | 8/2011 | Kim | H01L 27/0805 257/686 |
| 2011/0219876 A1* | 9/2011 | Kalnitsky | G01B 7/003 73/514.32 |
| 2012/0200330 A1* | 8/2012 | Kawagoe | H03K 5/133 327/161 |
| 2013/0292808 A1* | 11/2013 | Yen | H01L 23/552 257/660 |
| 2014/0093773 A1* | 4/2014 | Hashimoto | H01G 11/22 429/211 |
| 2014/0252573 A1 | 9/2014 | Lin et al. | |
| 2017/0084682 A1 | 3/2017 | Ajuria et al. | |

FOREIGN PATENT DOCUMENTS

| | | |
|---|---|---|
| KR | 1096598 | 12/2011 |
| KR | 20130017548 | 2/2013 |

* cited by examiner

US 10,262,967 B2

SEMICONDUCTOR PACKAGES

CROSS-REFERENCE TO RELATED APPLICATION

This application claims priority under 35 U.S.C. § 119 to Korean Patent Application No. 10-2017-0103698, filed on Aug. 16, 2017, in the Korean Intellectual Property Office, the disclosure of which is hereby incorporated by reference in its entirety.

FIELD

Example embodiments of the present disclosure relate to semiconductor packages and a method of manufacturing the same, and, more specifically, to wafer level packages including capacitors and a method of manufacturing the same.

BACKGROUND

A fan out wafer level package (FOWLP) can include a semiconductor chip embedded in a material, such as epoxy mold compound (EMC). However, it may be difficult for a capacitor to be embedded if the FOWLP is relatively thin. If a capacitor is formed on a lower surface of a redistribution layer, the thickness of a solder ball on the lower surface of the redistribution layer may need to be increased. If a capacitor is formed in the molding material, the total thickness of a package may need to be increased. If a silicon capacitor is formed in the package, the capacitance of the silicon capacitor may be too limited and manufacturing costs may also be increased.

SUMMARY

Embodiments according to the inventive concepts can provide semiconductor packages and methods of manufacturing the same. Pursuant to these embodiments, a semiconductor package can include a mold substrate having opposite first and second surfaces where a semiconductor chip can be embedded inside the mold substrate. The semiconductor chip can include chip pads where a redistribution layer can be on the first surface of the mold substrate, and the redistribution layer can include redistribution lines therein electrically connected to the chip pads and can include a capacitor redistribution line. A capacitor can include a first electrode including a plurality of conductive pillars connected to the capacitor redistribution line. A dielectric layer can be on the first electrode and a second electrode can be on the dielectric layer.

In some embodiments, a semiconductor package comprising redistribution lines including a capacitor redistribution line therein. A semiconductor chip can include chip pads thereon electrically connected to the redistribution lines. A capacitor can include a first electrode that includes a plurality of conductive pillars connected to the capacitor redistribution line, where the plurality of conductive pillars can be buried in the redistribution lines beneath the semiconductor chip. A dielectric layer can be on the first electrode and a second electrode can be on the dielectric layer.

In some embodiments, a method of manufacturing a semiconductor package can include mounting a semiconductor chip including chip pads, on a dummy substrate. A mold substrate can be formed on the dummy substrate to cover the semiconductor chip. The dummy substrate can be removed to expose a first surface of the mold substrate and a redistribution layer can be formed on the first surface of the mold substrate, where a redistribution layer can include redistribution lines electrically connected to the chip pads. A capacitor can be formed that can include a first electrode including a plurality of conductive pillars connected to a capacitor redistribution line, a dielectric layer on the first electrode, and a second electrode on the dielectric layer.

DETAILED DESCRIPTION

Figure 1:
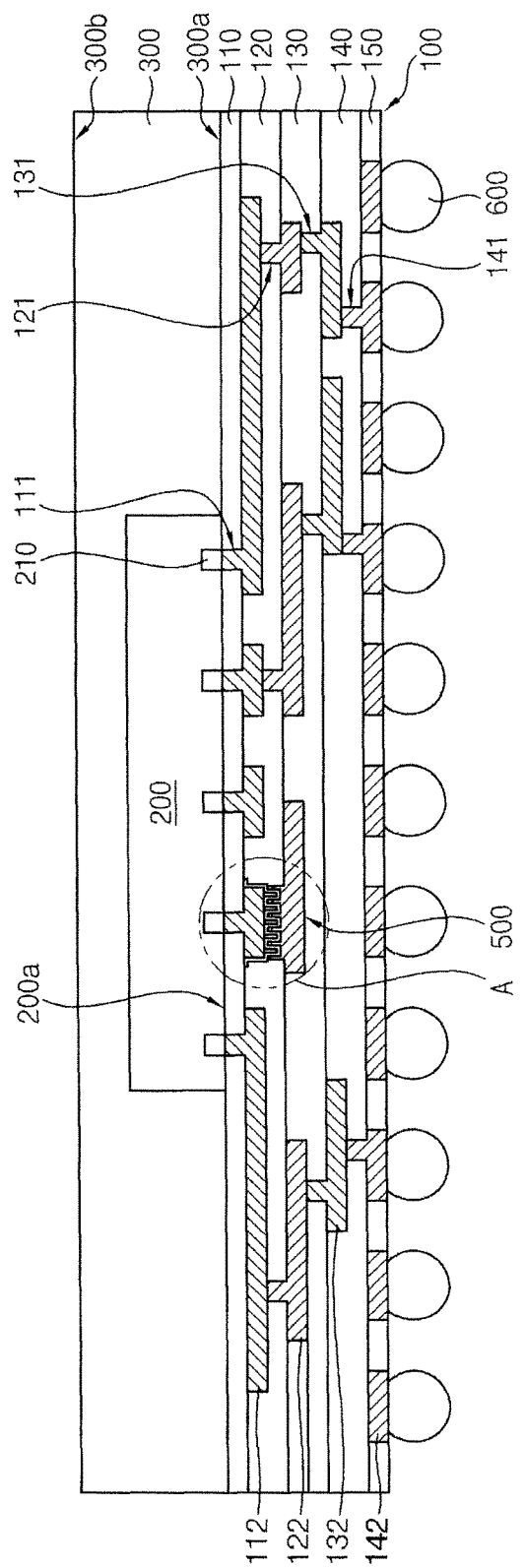
FIG. 1 is a cross-sectional view illustrating a semiconductor package according to example embodiments.

Various example embodiments are described hereinafter with reference to the accompanying drawings. Like reference numerals may refer to like elements throughout this application.

Figure 2:
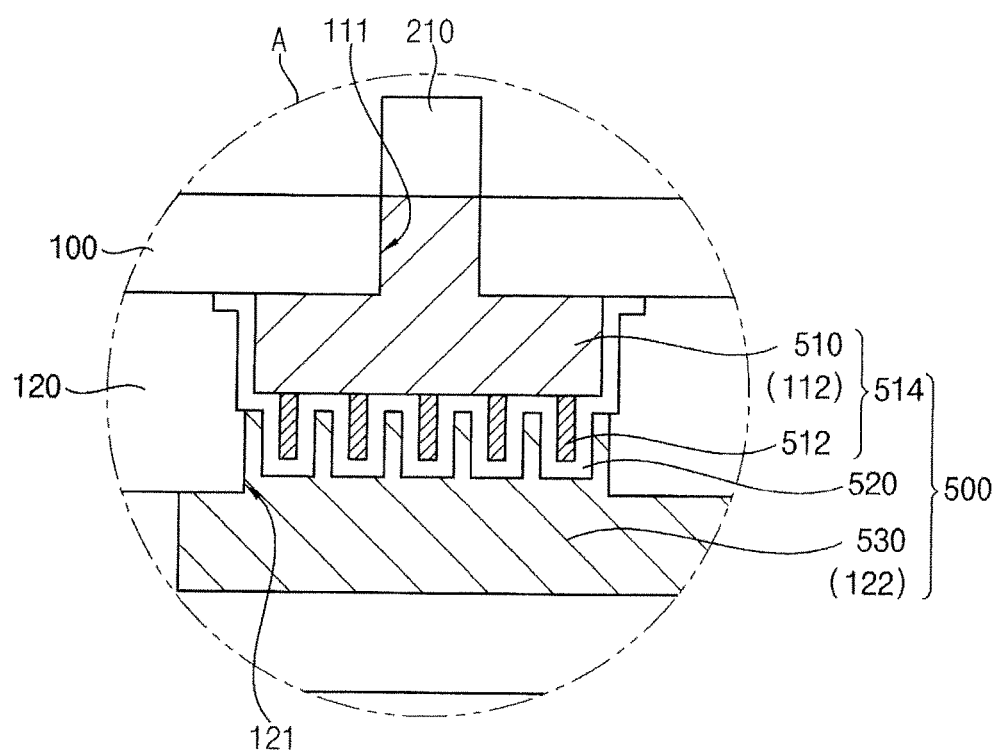
FIG. 2 is an enlarged view of portion A of FIG. 1.

FIG. 1 is a cross-sectional view illustrating a semiconductor package according to example embodiments. FIG. 2 is an enlarged view of portion A of FIG. 1.

Referring to FIGS. 1 and 2, a semiconductor package 1 may include a mold substrate 300, a semiconductor chip 200 in the mold substrate 300, a redistribution layer 100 including a plurality of redistribution lines that are electrically connected to chip pads 210 of the semiconductor chip 200 and covers a first surface 300a of the mold substrate 300, a capacitor 500 in the redistribution layer 100 and connected to at least one capacitor redistribution line 510 selected from the redistribution lines. The capacitor 500 may include a first electrode 514 including the capacitor redistribution line 510 and a plurality of conductive pillars 512 connected to and arranged on the capacitor redistribution line 510, a dielectric layer 520 on the first electrode 514, and a second electrode 530 on the dielectric layer 520. The semiconductor package 1 may further include outer connection terminals 600 on the redistribution layer 100.

In some embodiments, the semiconductor package 1 may be a fan-out wafer level package including the mold substrate 300 and the redistribution layer 100 formed on a first surface 300a of the mold substrate 300. The redistribution layer 100 may be formed on the first surface 300a of the mold substrate 300 by a wafer level redistribution layer process. At least one semiconductor chip 200 may be accommodated in the mold substrate 300. As shown in FIG. 1, the fan-out wafer level package can allow connectivity to relatively closely spaced chip pads via connections at the wafer level that are more widely spaced apart from one another compared to the chip pads. In still other embodiments, a fan-in wafer level package may be used to allow connectivity to relatively widely spaced chip pads via connections at the wafer level that are more closely spaced apart from one another compared to the chip pads.

The semiconductor chip 200 may include a plurality of the chip pads 210 on a first surface 200a (e.g., an active surface) thereof. The semiconductor chip 200 may be accommodated in the mold substrate 300 such that the first surface 200a thereof on which the chip pads 210 are disposed faces toward the redistribution layer 100. The first surface 200a of the semiconductor chip 200 may not be covered by the first surface 300a of the mold substrate 300 (i.e., is not covered by the mold substrate 300 so that the chip pads 210 of the first surface 200a are available for connection to the underlying redistribution layers).

In some embodiments, the number, configuration and arrangement of the chip pads 210 may be modified according to the inventive concepts.

The semiconductor chip 200 may include integrated circuits. For example the semiconductor chip 200 may be a logic chip including logic circuits, such as a controller to control a memory chip. The semiconductor chip 200 may be a memory chip including memory circuits, such as a dynamic random access memory (DRAM), a static random access memory (SRAM), a flash memory, a phase change memory (PRAM), a resistive random access memory (ReRAM), a ferroelectric random access memory (FRAM), or a magnetic random access memory (MRAM).

In some embodiments, a plurality of stacked semiconductor chips 200 may be provided in the semiconductor package 1.

Some of the redistribution lines of the redistribution layer 100 may contact the chip pads 210 exposed from the first surface 300a of the mold substrate 300. It will be understood that in some embodiments additional elements may be included between redistribution lines of the redistribution layer 100 and the respective chip pads 210, but still provide electrical conductivity therebetween.

The redistribution layer 100 may include a first insulating layer 110 and first redistribution lines 112. The first insulating layer 110 may be formed on the first surface 300a of the mold substrate 300 and include first openings 111 exposing the chip pads 210. The first redistribution lines 112 may be formed on the first insulating layer 110. The first redistribution lines 112 may be directly connected to the chip pads 210 through the first openings 111.

The first redistribution lines 112 may each include, for example, aluminum (Al), copper (Cu), tin (Sn), nickel (Ni), gold (Au), platinum (Pt) or an alloy thereof.

The redistribution layer 100 may include a second insulating layer 120 and second redistribution lines 122. The second insulating layer 120 may be formed on the first insulating layer 110 and include second openings 121 exposing portions of the first redistribution lines 112. The second redistribution lines 122 may be formed on the second insulating layer 120. The second redistribution lines 122 may be directly connected to the first redistribution lines 112 through the second openings 121.

The redistribution layer 100 may include a third insulating layer 130 and third redistribution lines 132. The third insulating layer 130 may be formed on the second insulating layer 120 and include third openings 131 exposing the second redistribution lines 122. The third redistribution lines 132 may be formed on the third insulating layer 130. The third redistribution lines 132 may be directly connected to the second redistribution lines 122 through the third openings 131.

The redistribution layer 100 may include a fourth insulating layer 140 and fourth redistribution lines 142. The fourth insulating layer 140 may be formed on the third insulating layer 130 and include fourth openings 141 exposing the third redistribution lines 132. The fourth redistribution lines 142 may be formed on the fourth insulating layer 140. The fourth redistribution lines 142 may be directly connected to the third redistribution lines 132 through the fourth openings 141.

The redistribution layer 100 may include a fifth insulating layer 150 which is formed on the fourth insulating layer 140 to be disposed between the fourth redistribution lines 142, such that a surface of each of the fourth redistribution lines 142 may be uncovered (i.e., exposed) by the fifth insulating layer 150. Therefore, the redistribution layer 100 including fan-out solder ball landing pads may be formed by performing a semiconductor fabrication process on the mold substrate 300 corresponding to each die of a wafer.

In some embodiments, the semiconductor package 1 may include the capacitor 500 embedded in the redistribution layer 100.

Referring to FIG. 2, the capacitor redistribution line 510 may be at least one redistribution line that is selected from the first redistribution lines 112, but the inventive concepts are not limited thereto. In some embodiments, the capacitor redistribution line 510 may be a redistribution line selected from the second, third, and fourth redistribution lines 122, 132 and 142.

The capacitor redistribution line 510 may have a predetermined planar area depending on a capacitance of the capacitor 500. The capacitor redistribution line 510 may be disposed to overlap or be in the vicinity of (not to overlap) the first semiconductor chip 200, in a plan view.

The conductive pillars 512 may be arranged in an array or in a plurality of arrays that may be contiguous with one another. The conductive pillars 512 may include, for example, carbon nanofibers (CNFs) that are formed by a carbon nanofiber growth process. The conductive pillars 512 may extend from a surface of the capacitor redistribution line 510 in a vertical direction relative to the first surface 300a of the mold substrate 300. The conductive pillars 512 may each have a length of about 0.1 μm to about 100 μm and a diameter of about 20 nm to 100 nm.

The dielectric layer 520 may cover the conductive pillars 512 on the capacitor redistribution line 510. The second electrode 530 may be disposed on the dielectric layer 520, opposite to the capacitor redistribution line 510. In some embodiments, the second electrode 530 may include protruding portions, respective ones of which fill spaces defined by the dielectric layer 520 between the conductive pillars 512. As shown in FIG. 2, the conductive pillars 512 and the protruding portions may be interdigitated with one another with the dielectric layer 520 therebetween.

The capacitor redistribution line 510 and the second electrode 530 may include a first conductive material. The conductive pillars 512 may include a second conductive material different from the first conductive material.

The capacitor redistribution line 510 may be one of the first redistribution lines 112 disposed in a first layer. The second electrode 530 may be one of the second redistribution lines 122 disposed in a second layer. The conductive pillars 512 may be disposed between the first layer and the second layer.

The capacitor 500 may be formed to have a thin thickness and a high capacitance at a desired location in the redistribution layer 100. Thus, the capacitor 500 with a desired capacitance may be installed in the semiconductor package 1 (that is a fan-out wafer level package) having a thin thickness. The capacitor 500 may provide various functions, such as decoupling, filtering, and/or resonance damping.

The outer connection terminals 600 may be disposed on the fourth redistribution lines 142, respectively. The outer connection terminals 600 may each include a solder ball.

The fourth redistribution lines 142 may each serve as a landing pad, e.g., a package pad.

As described above, the semiconductor package 1 that is the fan-out wafer level package may include the fan-out redistribution layer 100 that is formed on the first surface 300a of the mold substrate 300 by the redistribution layer process and the capacitor 500 that is embedded in the redistribution layer 100. The capacitor 500 may include the first electrode 514 including the plurality of conductive pillars 512 that are arranged in array on the capacitor redistribution line 510 of the redistribution lines.

The capacitor 500 may have the thin thickness and the high capacitance at the desired location in the redistribution layer 100. The capacitor 500 may be formed in the fan-out redistribution layer 100 with the thin thickness, such that the semiconductor package (that is the fan-out wafer level package) 1 may be provided to have desired electrical characteristics and the desired thin thickness.

Hereinafter, a method of manufacturing the semiconductor package 1 of FIG. 1 will be described.

FIGS. 3 to 15 are cross-sectional views illustrating a method of manufacturing a semiconductor package according to example embodiments. FIGS. 8 to 12 are enlarged views illustrating portion B of FIG. 7. The same reference numerals will be used to denote the same elements as in FIGS. 1 and 2

Figure 3:
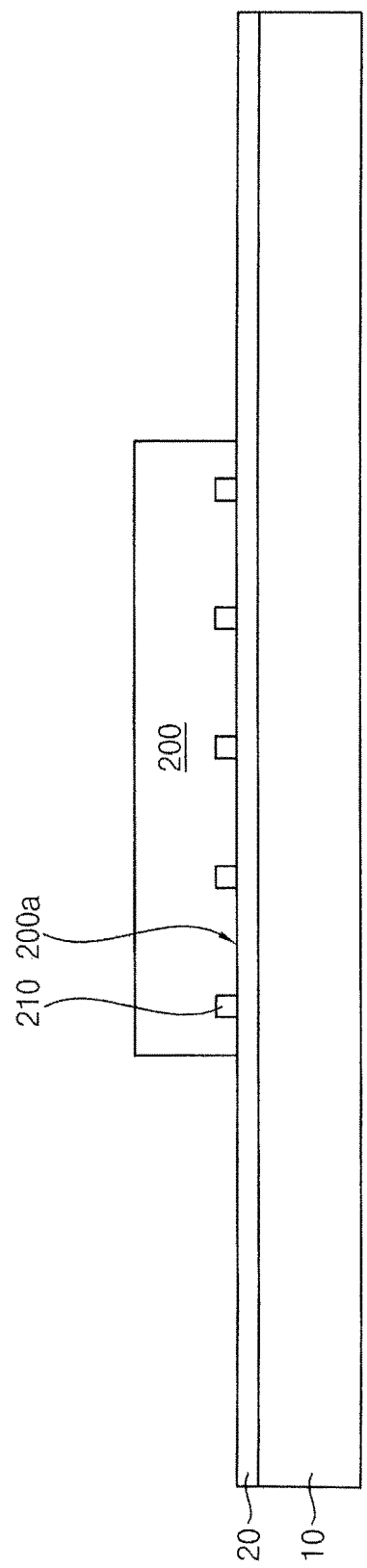
FIGS. 3 to 15 are cross-sectional views illustrating a method of manufacturing a semiconductor package according to example embodiments.

Referring to FIG. 3, after forming a separation layer 20 on a dummy substrate 10, the semiconductor chip 200 may be stacked on the separation layer 20.

In some embodiments, the dummy substrate 10 may be used as a base substrate on which at least one semiconductor chip is stacked and a mold substrate 300 is to be formed to cover the semiconductor chip. The dummy substrate 10 may have a size corresponding to a wafer on which a semiconductor fabrication process is performed. The dummy substrate 10 may include, for example, a silicon substrate, a glass substrate, or a non-metal or metal plate.

The separation layer 20 may include a polymer tape acting as a temporary adhesive. The separation layer 20 may include a material capable of losing adhesive strength when it is subjected to light or heat. The separation layer 20 may include, for example, dual curing silicone adhesive capable of cross-linking upon exposure to visible light or ultraviolet radiation.

In some embodiments, the semiconductor chip 200 may include a plurality of the chip pads 210 on the first surface 200a (e.g., active surface) thereof. The semiconductor chip 200 may be disposed on the dummy substrate 10 such that the first surface 200a thereof on which the chip pads 210 are formed faces toward the dummy substrate 10.

In some embodiments, the number, configuration and arrangement of the chip pads 210 may be modified according to the inventive concepts. In some embodiments, a plurality of stacked semiconductor chips 200 may be formed on the dummy substrate 10.

The semiconductor chip 200 may include integrated circuits. For example the semiconductor chip 200 may be a logic chip including logic circuits, such as a controller to control a memory chip. The semiconductor chip 200 may be a memory chip including memory circuits, such as DRAM, SRAM, a flash memory, PRAM, ReRAM, FRAM, or MRAM.

Figure 4:
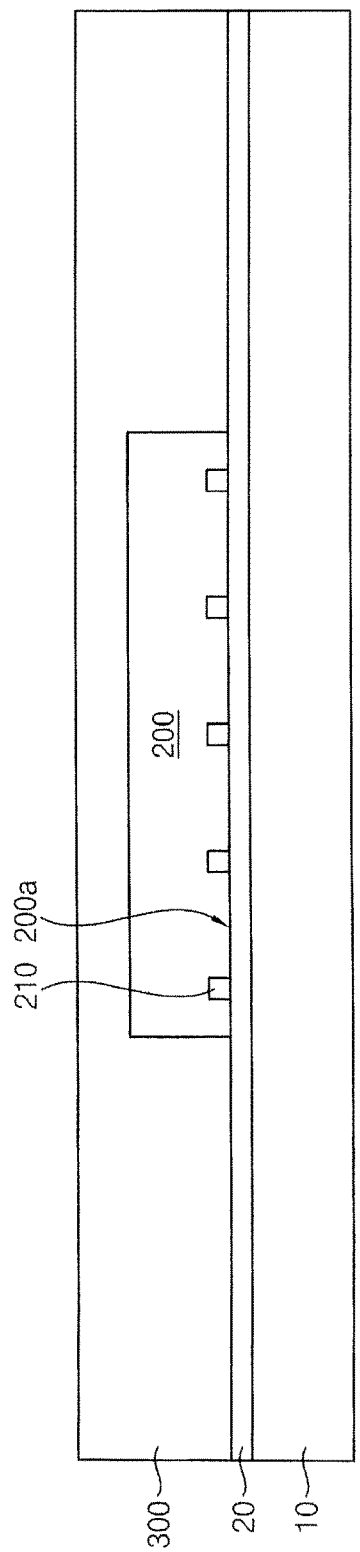

Referring to FIG. 4, the mold substrate 300 may be formed on the dummy substrate 10 to cover the semiconductor chip 200.

In some embodiments, the mold substrate 300 covering the semiconductor chip 200 may be formed by forming a molding material on the separation layer 20 by a molding process. The mold substrate 300 may include, for example, an epoxy molding compound.

Figure 5:
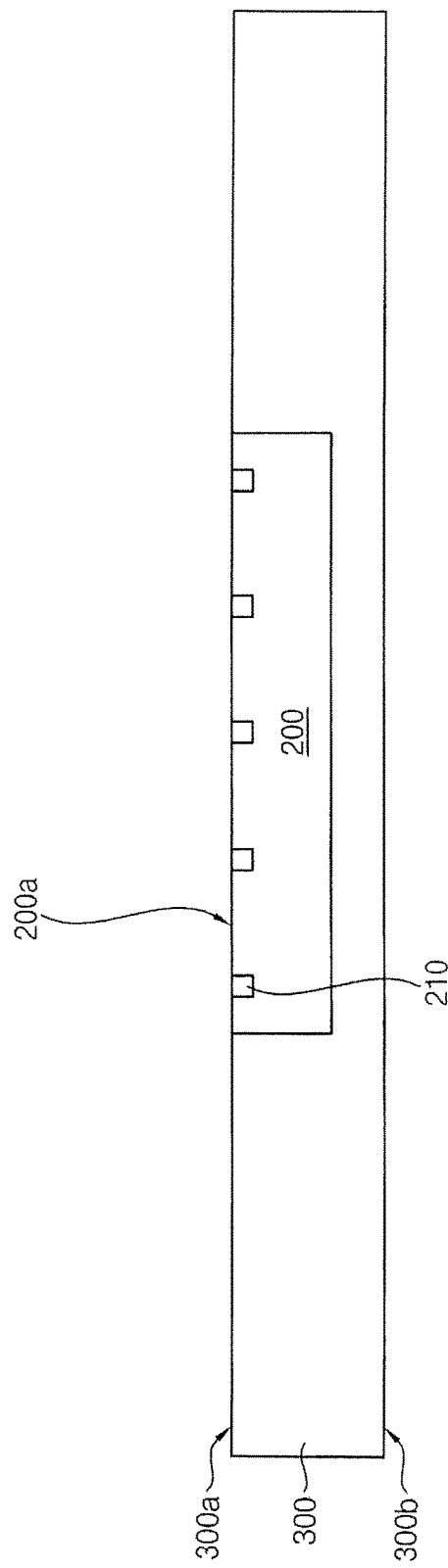

Referring to FIG. 5, the structure of FIG. 4 including the mold substrate 300 can be inverted and the dummy substrate 10 and the separation layer 20 may be removed from the mold substrate 300. It will be understood that, in some embodiments, the inversion of the mold substrate 300 may be provided by a relative inversion rather than by absolute inversion.

In some embodiments, the separation layer 20 may be irradiated with light or heated to remove the dummy substrate 10 from the mold substrate 300. Since the dummy substrate 10 is removed, the first surface 200a of the semiconductor chip 200 and the chip pads 210 may be exposed as shown.

Figure 6:
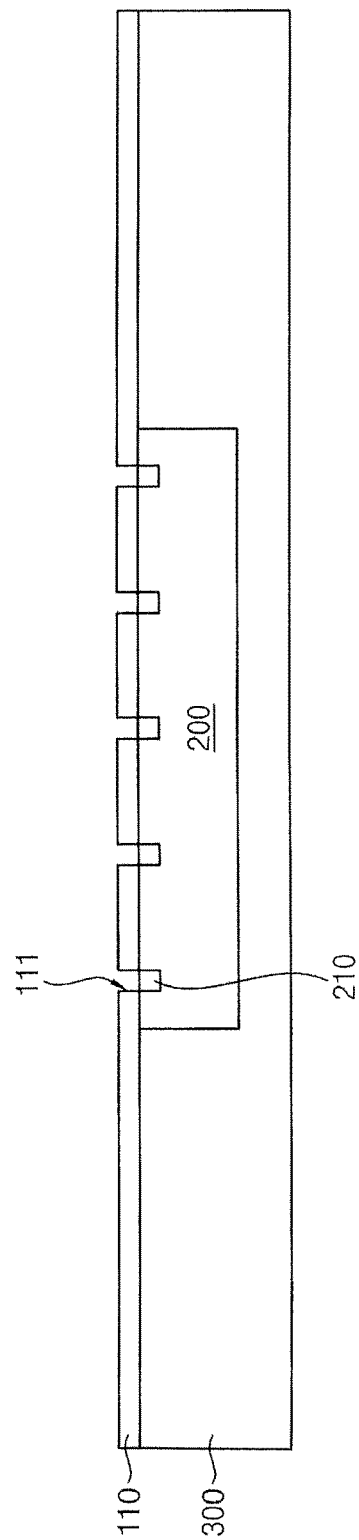

Referring to FIG. 6, after forming a first insulating layer 110 to cover the first surface 300a of the mold substrate 300, the first insulating layer 110 may be patterned to form the first openings 111 exposing the chip pads 210.

The first insulating layer 110 may include, for example, a polymer or a dielectric material. The first insulating layer 110 may be formed by, for example, a vapor phase deposition process or a spin coating process.

Figure 7:
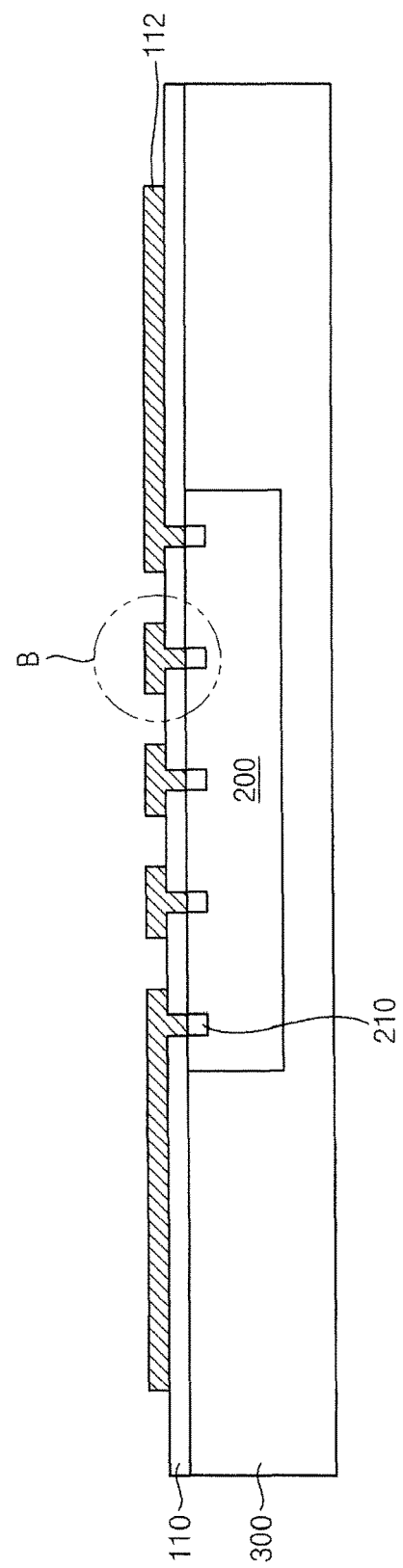

Referring to FIG. 7, the first redistribution lines 112 may be formed on the first insulating layer 110. The first redistribution lines 112 may be directly connected to the chip pads 210 through the first openings 111.

In some embodiments, the first redistribution lines 112 may be formed on a portion of the first insulating layer 110 and the chip pads 210, respectively. The first redistribution lines 112 may be formed by, after forming a seed layer on the first insulating layer 110 and in the first openings 111, patterning the seed layer and performing an electrolytic plating process. Thus, the first redistribution lines 112 may directly contact the chip pads 210 through the first openings 111.

The first redistribution lines 112 may include Al, Cu, Sn, Ni, Au, Pt, or an alloy thereof.

Figure 8:
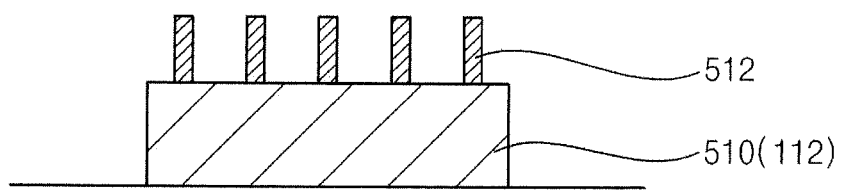
Figure 9:
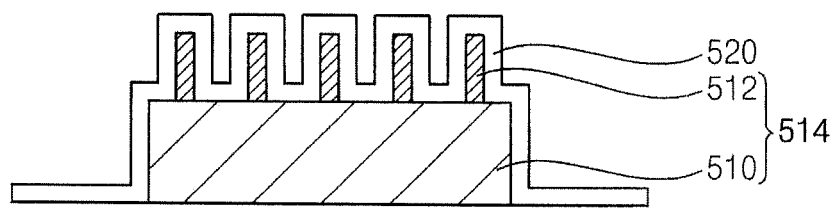

Referring to FIGS. 8 and 9, after forming a plurality of the conductive pillars 512 on at least one capacitor redistribution line 510 selected from the first redistribution lines 112, the dielectric layer 520 may be formed along upper and side surfaces of the conductive pillars 512.

In some embodiments, an insulating layer may be formed to expose only the capacitor redistribution line 510, and then, the conductive pillars 512 may be formed to be arranged in an array on the exposed capacitor redistribution line 510. The conductive pillars 512 may form the first electrode 514 of the capacitor together with the capacitor redistribution line 510

The conductive pillars 512 may be, for example, carbon nanofibers (CNFs) formed by a carbon nanofiber growth process. The conductive pillars 512 may extend from a surface of the capacitor redistribution line 510 in a vertical direction relative to the first surface 300a of the mold substrate 300. The conductive pillars 512 may each have a length of about 0.1 on to about 100 μm and a diameter of about 20 nm to 100 nm.

The capacitor redistribution line 510 may include a first material different from a second material used for forming the conductive pillars 512.

The dielectric layer 520 may be conformally formed on the capacitor redistribution line 510 to cover the conductive pillars 512. The dielectric layer 520 may be formed by, for example, a plasma chemical vapor deposition process. The dielectric layer 520 may be formed by, for example, a fluorocarbon deposition process.

Figure 10:
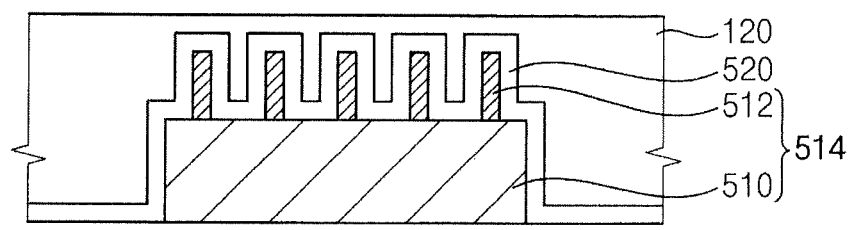
Figure 11:
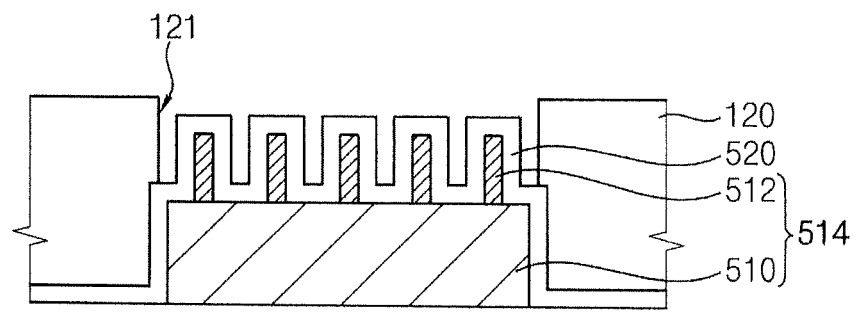

Referring to FIGS. 10 and 11, after forming the second insulating layer 120 on the first surface 300a of the mold substrate 300 to cover the first redistribution lines 112 including the capacitor redistribution line 510, the second openings 121 may be formed to expose the first redistribution lines 112 and the dielectric layer 520 on the conductive pillars 512.

The second insulating layer 120 may include, for example, a polymer or a dielectric material. The second insulating layer 120 may be formed by, for example, a vapor phase deposition process or a spin coating process.

Figure 12:
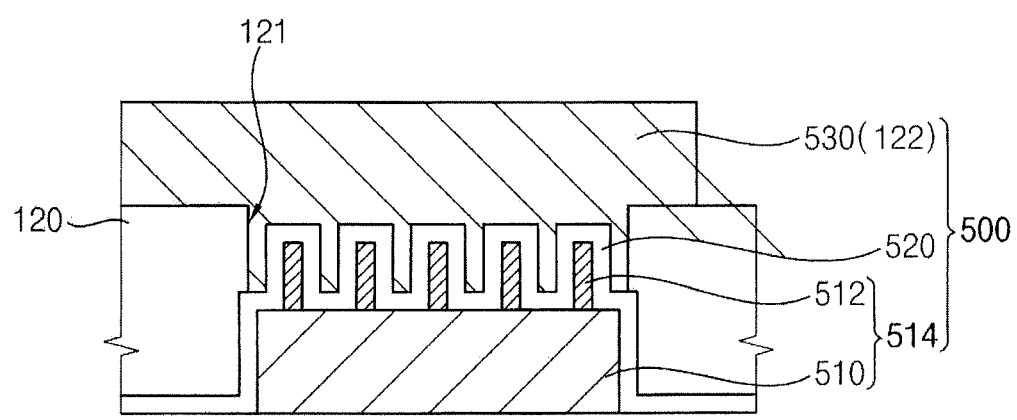
Figure 13:
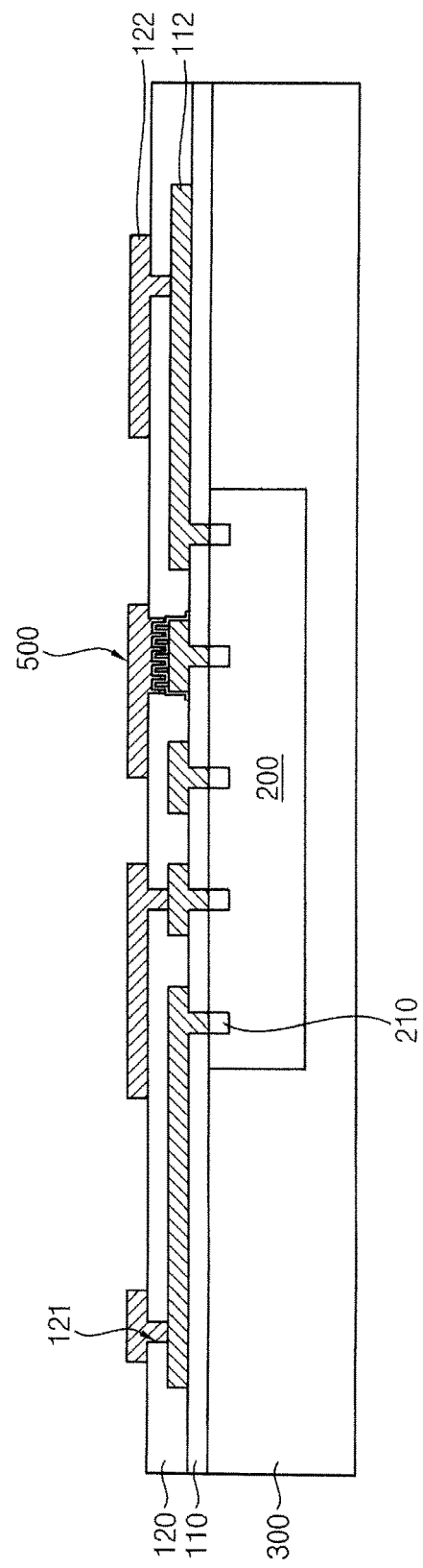

Referring to FIGS. 12 and 13, the second redistribution lines 122 may be formed on the second insulating layer 120. The second redistribution lines 122 may be directly connected to the first redistribution lines 112 through the second openings 121. The second electrode 530 may be formed on the dielectric layer 520 exposed by one of the second openings 121. In some embodiments, the second electrode 530 may fill a space defined by the dielectric layer 520 between the conductive pillars 512. The second electrode 530 may be included in the second redistribution lines 122.

The second redistribution lines 122 including the second electrode 530 may be formed by, after forming a seed layer on the second insulating layer 120 and in the second openings 121, patterning the seed layer and performing an electrolytic plating process.

As shown in FIG. 12, the embedded capacitor 500 may be formed between one of the first redistribution lines 112 and one of the second redistribution lines 122. The capacitor 500 may include the first electrode 514 including the capacitor redistribution line 510 and the conductive pillars 512 on the capacitor redistribution line 510, the dielectric layer 520 on the first electrode 514, and the second electrode 530 on the dielectric layer 520.

Figure 14:
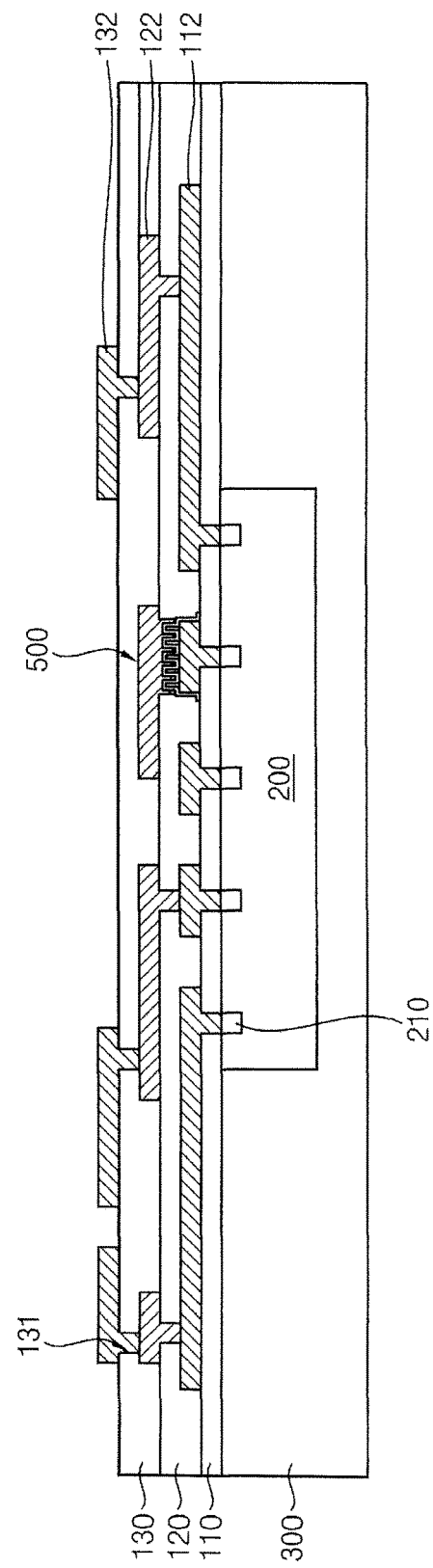
Figure 15:
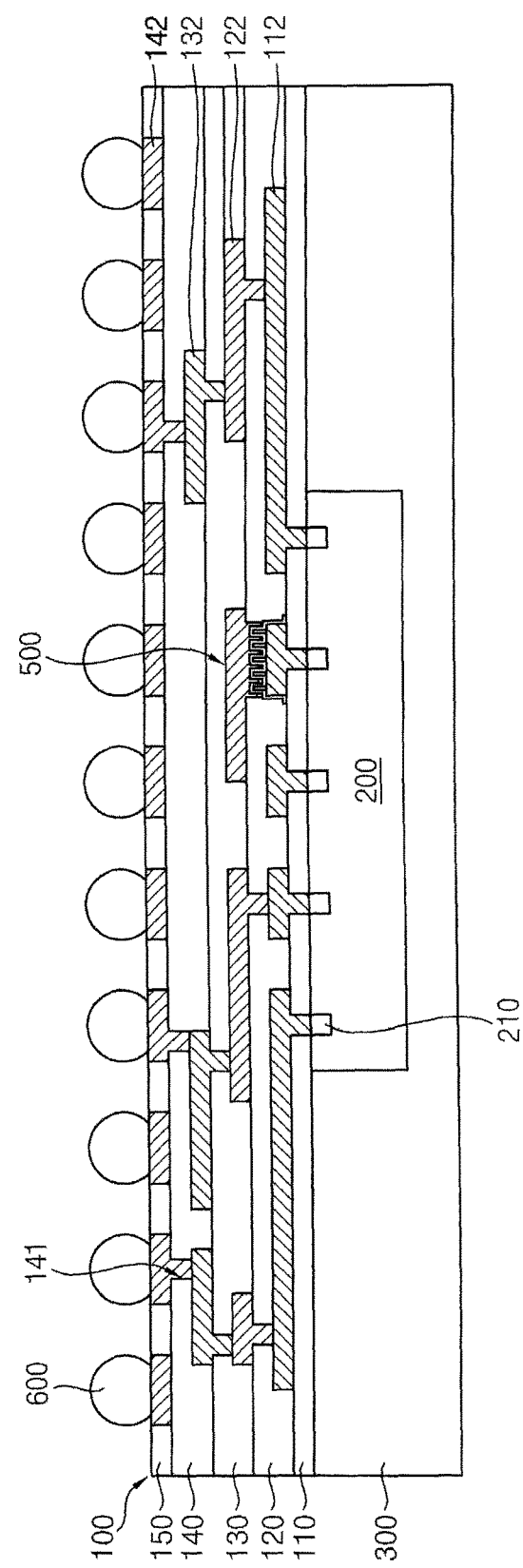

Referring to FIGS. 14 and 15, after forming portions of the redistribution layer 100 on the first surface 300a of the mold substrate 300 by performing processes similar to those described with reference to FIGS. 6 and 7, the outer connection terminals 600 may be formed on the redistribution layer 100.

In some embodiments, the third insulating layer 130 and the third redistribution lines 132 may be formed on the second insulating layer 120 and the second redistribution lines 122. The third insulating layer 130 may include the third openings 131 exposing the second redistribution lines 122. The third redistribution lines 132 may be formed on the second insulating layer 120 and be connected to the second redistribution lines 122.

Thereafter, the fourth insulating layer 140 and the fourth redistribution lines 142 may be formed on the third insulating layer 130 and the third redistribution lines 132. The fourth insulating layer 140 may include the fourth openings 141 exposing the third redistribution lines 132. The fourth redistribution lines 142 may be formed on the third insulating layer 130 and be connected to the third redistribution lines 132.

Therefore, the redistribution layer 100, including the first to fourth redistribution lines 112, 122, 132, and 142 connected to the chip pads 210, may be formed on the first surface 300a of the mold substrate 300. In some embodiments, the number or arrangement of the insulating layers and the redistribution lines in the redistribution layer 100 may be modified according to the inventive concepts.

The outer connection terminals 600 may be formed on the redistribution layer 100 to be electrically connected to the first to fourth redistribution lines 112, 122, 132, and 142. For example, the outer connection terminals 600 may be formed on the fourth redistribution lines 142, respectively. The outer connection terminals 600 may each be, for example, a solder ball. At least a portion of each of the fourth redistribution lines 142 may act as a landing pad, e.g., a package pad. Accordingly, the redistribution layer 100 including fan-out solder ball landing pads may be formed by performing a semiconductor fabrication process on the mold substrate 300 corresponding to each die of a wafer.

Thereafter, the mold substrate 300 may be separately formed through a sawing process such that the fan-out wafer level package (i.e., the semiconductor package 1 of FIG. 1) including the mold substrate 300, the semiconductor chip 200 in the mold substrate 300, and the redistribution layer 100 on the mold substrate 300 may be formed.

Figure 16:
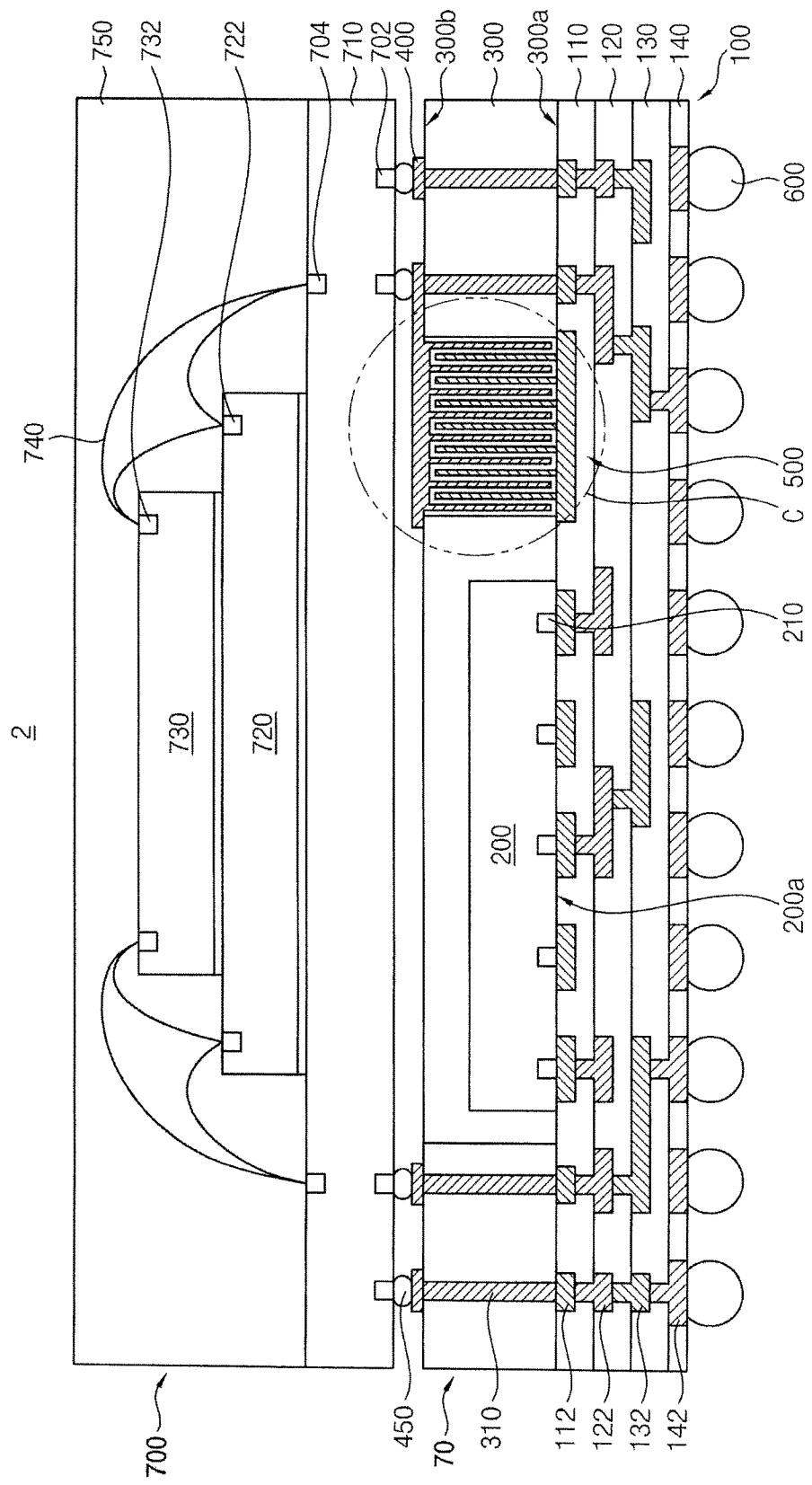
FIG. 16 is a cross-sectional view illustrating a semiconductor package according to example embodiments.
Figure 17:
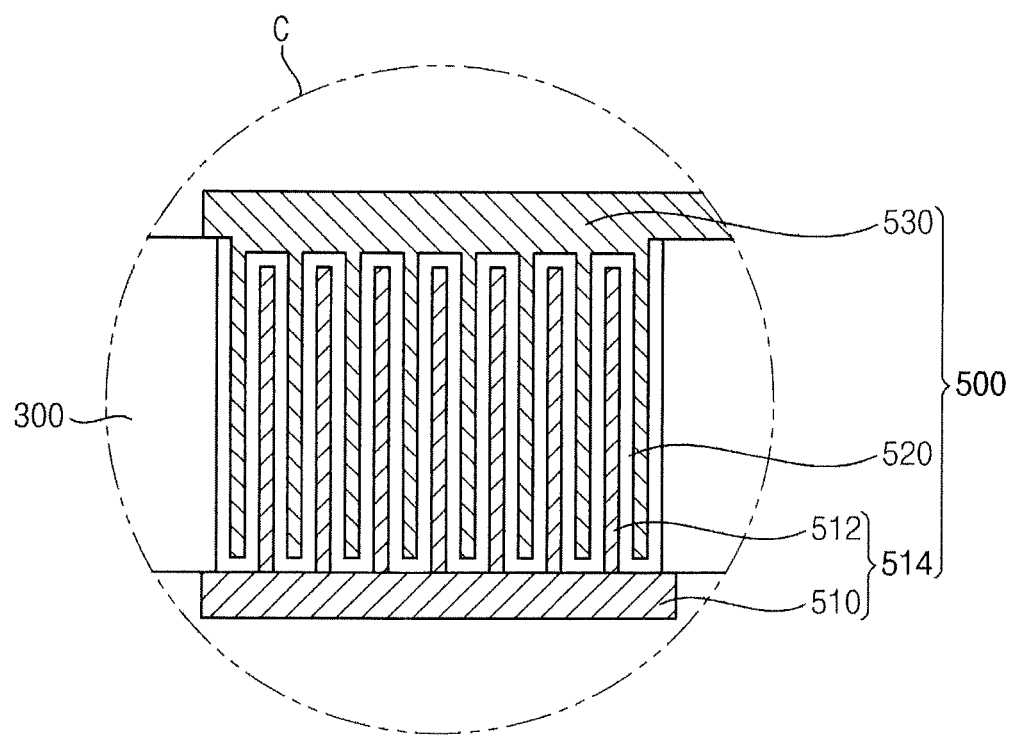
FIG. 17 is an enlarged view of portion C of FIG. 16.
Figure 18:
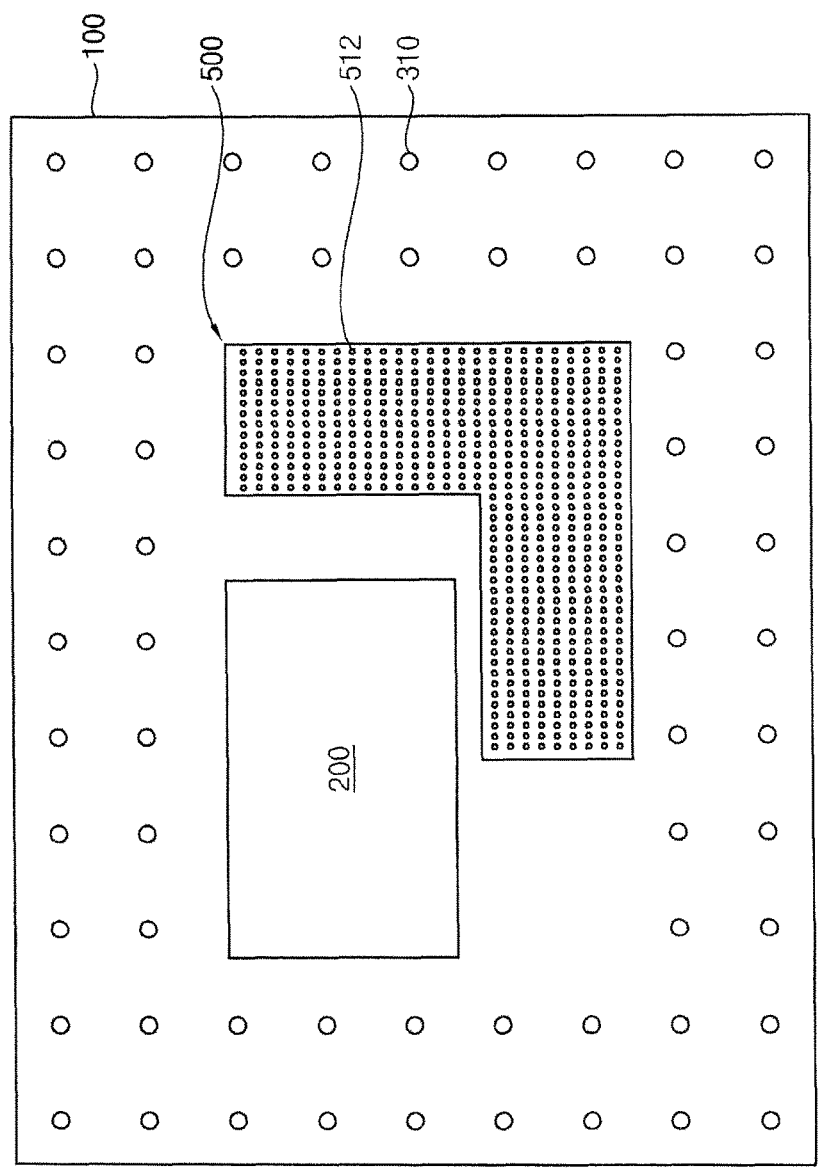
FIG. 18 is a plan view illustrating a capacitor on a redistribution layer of FIG. 16.

FIG. 16 is a cross-sectional view illustrating a semiconductor package according to example embodiments. FIG. 17 is an enlarged view of portion C of FIG. 16. FIG. 18 is a plan view illustrating a capacitor on a redistribution layer of FIG. 16. The same numeral numbers will be used to denote the same elements as in FIGS. 1 and 2. Therefore, repeated descriptions thereof will be omitted or mentioned briefly.

Referring to FIGS. 16 to 18, a semiconductor package 2 may include a first package 70 and a second package 700 on the first package 70. The second package 700 may be stacked on the first package 70 using conductive connection members 450 as a connection intermediary, In some embodiments, the first package 70 may include the mold substrate 300, a first semiconductor chip 200 in the mold substrate 300, the redistribution layer 100 on the first surface 300a of the mold substrate 300, and the capacitor 500 in the mold substrate 300. The redistribution layer 100 may cover the first surface 300a of the mold substrate 300 and include a plurality of redistribution lines connected to chip pads 210 of the first semiconductor chip 200. The first package 70 may further include conductive connection pillars 310 at least partly penetrating the mold substrate 300 in an edge region of the mold substrate 300 in the vicinity of the first semiconductor chip 200.

The first package 70 may be a fan-out wafer level package including the mold substrate 300 and the redistribution layer 100 on the first surface 300a of the mold substrate 300. The redistribution layer 100 may be formed on the first surface 300a of the mold substrate 300 by a wafer level redistribution process. At least one first semiconductor chip 200 may be disposed within the mold substrate 300.

Some of the redistribution lines in the redistribution layer 100 may be directly connected to the chip pads 210 exposed from the first surface 300a of the mold substrate 300. For example, the redistribution layer 100 may include the first redistribution lines 112 directly connected to the chip pads 210. The first redistribution lines 112 may be formed on the chip pads 210 and on the conductive connection pillars 310. The first redistribution lines 112 may include, for example, Al, Cu, Sn, Ni, Au, Pt, or an alloy thereof.

The first package 70 may further include a backside redistribution layer including backside redistribution lines 400 on a second surface 300b of the mold substrate 300 opposite to the first surface 300a thereof. The backside redistribution lines 400 may be formed on the conductive connection pillars 310 exposed from the second surface 300b of the mold substrate 300 to be electrically connected to the conductive connection pillars 310. In some embodiments, the backside redistribution layer may include backside redistribution lines that are stacked in multiple layers.

In some embodiments, the first package 70 may include an embedded capacitor 500 therein.

Referring to FIG. 17, the capacitor 500 may include, the first electrode 514, the dielectric layer 520 on the first electrode 514, and the second electrode 530 on the dielectric layer 520. The first electrode 514 may include the capacitor redistribution line 510 of the redistribution lines and a plurality of the conductive pillars 512 on the capacitor redistribution line 510.

The capacitor redistribution line 510 may be at least one redistribution line selected from the first redistribution lines 112. The capacitor redistribution line 510 may be disposed on the first surface 300a of the mold substrate 300. The second electrode 530 may be one of the backside redistribution lines 400 on the second surface 300b of the mold substrate 300.

Referring to FIG. 18, the capacitor redistribution line 510 may have a predetermined planar area depending on a capacitance of the capacitor 500. The capacitor redistribution line 510 may be disposed to be spaced from and in the vicinity of the first semiconductor chip 200.

The conductive pillars 512 may be arranged in array on the capacitor redistribution line 510. The conductive pillars 512 may be disposed in the mold substrate 300.

The conductive pillars 512 may include, for example, carbon nanofibers (CNFs) that are formed by a carbon nanofiber growth process. The conductive pillars 512 may extend from a surface of the capacitor redistribution line 510 in a vertical direction relative to the first surface 300a of the mold substrate 300. The conductive pillars 512 may each have a length of about 0.1 µm to about 100 µm and a diameter of about 20 nm to 100 nm.

The dielectric layer 520 may cover the conductive pillars 512 on the capacitor redistribution line 510. The second electrode 530 may be disposed on the dielectric layer 520, opposite to the capacitor redistribution line 510. In some embodiments, the second electrode 530 may fill a space defined by the dielectric layer 520 between the conductive pillars 512.

The capacitor 500 may include the selected one (or the capacitor redistribution line 510) of the first redistribution lines 112 as a part of the first electrode 514. The capacitor 500 may be formed to have a thin thickness and a high capacitance at a desired location in the mold substrate 300. Thus, the capacitor 500 with a desired capacitance may be installed in the first package 70 (that is a fan-out wafer level package) having a thin thickness.

The second package 700 may include a second package substrate 710, second and third semiconductor chips 720 and 730 mounted on the second package substrate 710, and a molding member 750 on the second package substrate 710 to cover the second and third semiconductor chips 720 and 730.

The second package 700 may be stacked on the second surface 300b of the mold substrate 300 of the first package 70. The second package 700 may be electrically connected to the first package 70 by the conductive connection members 450. The conductive connection members 450 may each include a solder ball or a conductive bump. The conductive connection members 450 may be respectively disposed between each of first connection pads 702 of the second package substrate 710 and each of the backside redistribution lines 400 on the respective conductive connection pillars 310.

The second and third semiconductor chips 720 and 730 may be stacked on the second package substrate 710 by adhesives. The bonding wires 740 may connect chip pads 722 and 732 of the second and third semiconductor chips 720 and 730 to second connection pads 704 of the second package substrate 710, such that the second and third semiconductor chips 720 and 730 may be electrically connected to the second package substrate 710.

Although the second package 700 includes two semiconductor chips mounted by a wire-bonding method, the number and the mounting method of the semiconductor chips in the second package 700 are not limited thereto.

In some embodiments, the semiconductor package 2 may include only the first package 70. In this case, the second electrode 530 of the capacitor 500 may be one of the backside redistribution lines 400 on the second surface 300b of the mold substrate 300.

Hereinafter, a method of manufacturing the semiconductor package 2 of FIG. 16 will be described.

Figure 25:
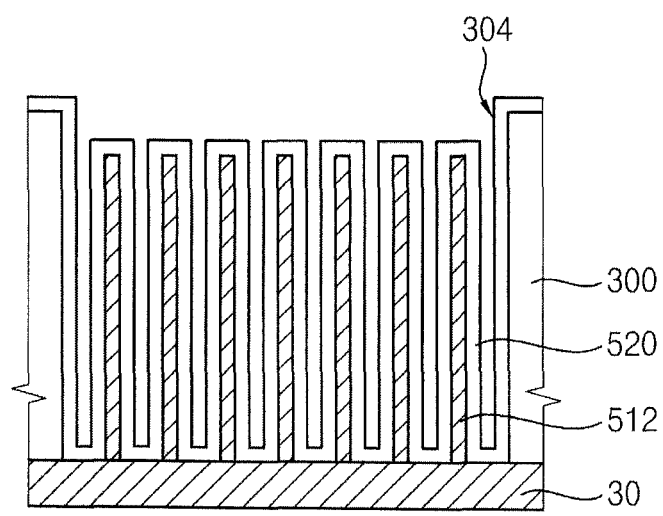
Figure 26:
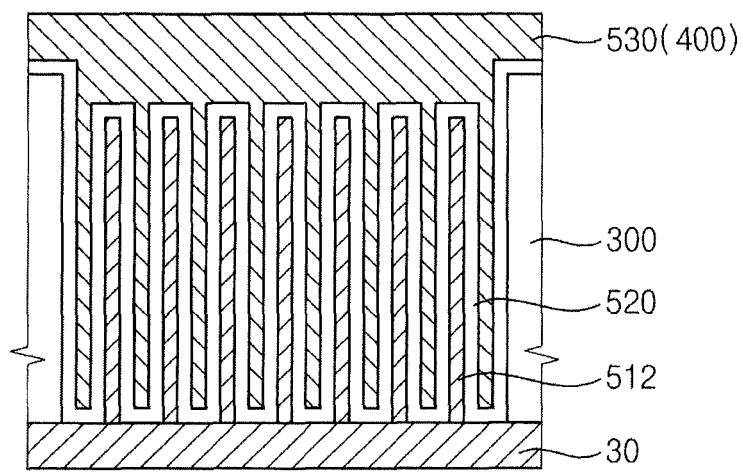

FIGS. 19 to 32 are cross-sectional views illustrating a method of manufacturing a semiconductor package according to example embodiments. FIGS. 24 to 26 are enlarged views illustrating portion D of FIG. 23. The same reference numerals will be used to denote the same elements as in FIGS. 3 to 15, and 16 to 18.

Figure 19:
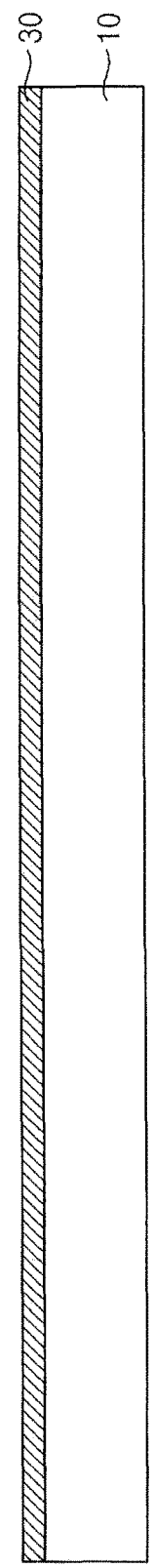
FIGS. 19 to 32 are cross-sectional views illustrating a method of manufacturing a semiconductor package according to example embodiments.

Referring to FIG. 19, a conductive layer 30 may be formed on the dummy substrate 10.

In some embodiments, the dummy substrate 10 may be used as a base substrate on which at least one semiconductor chip is stacked and the mold substrate is to be formed to cover the semiconductor chip. The dummy substrate 10 may have a size corresponding to a wafer on which a semiconductor fabrication process is performed. The dummy substrate 10 may include a silicon substrate, a glass substrate, or a non-metal or metal plate.

The conductive layer 30 may be formed by laminating a metal foil. Alternatively, the conductive layer 30 may be formed by depositing a metal. The metal may include, for example, Cu, Al, Au, Ni, tungsten (W), titanium (Ti), or an alloy thereof.

Figure 20:
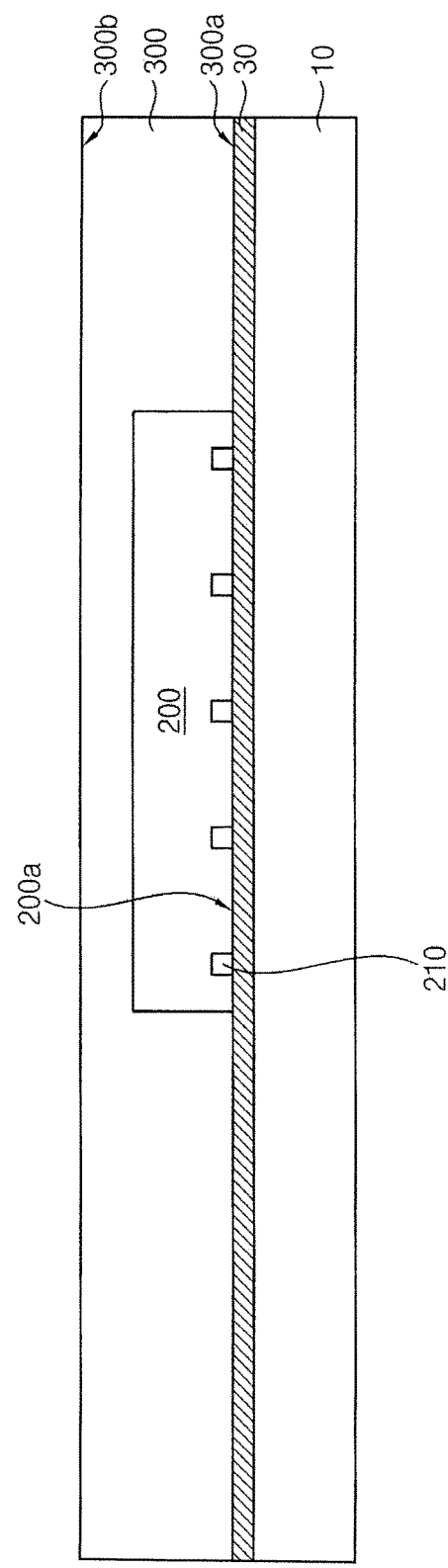

Referring to FIG. 20, the first semiconductor chip 200 may be mounted on the conductive layer 30. The mold substrate 300 may be formed on the conductive layer 30 to cover the first semiconductor chip 200 by, for example, a molding process. The mold substrate 300 may have the first surface 300a contacting the conductive layer 30 and the second surface 300b opposite to the first surface 300a. The mold substrate 300 may include, for example, epoxy molding compound.

In some embodiments, the first semiconductor chip 200 may include a plurality of the chip pads 210 on the first surface 200a (e.g., active surface) thereof. The first semiconductor chip 200 may be disposed on the dummy substrate 10 such that the first surface 200a thereof on which the chip pads 210 are formed faces toward the dummy substrate 10.

Figure 21:
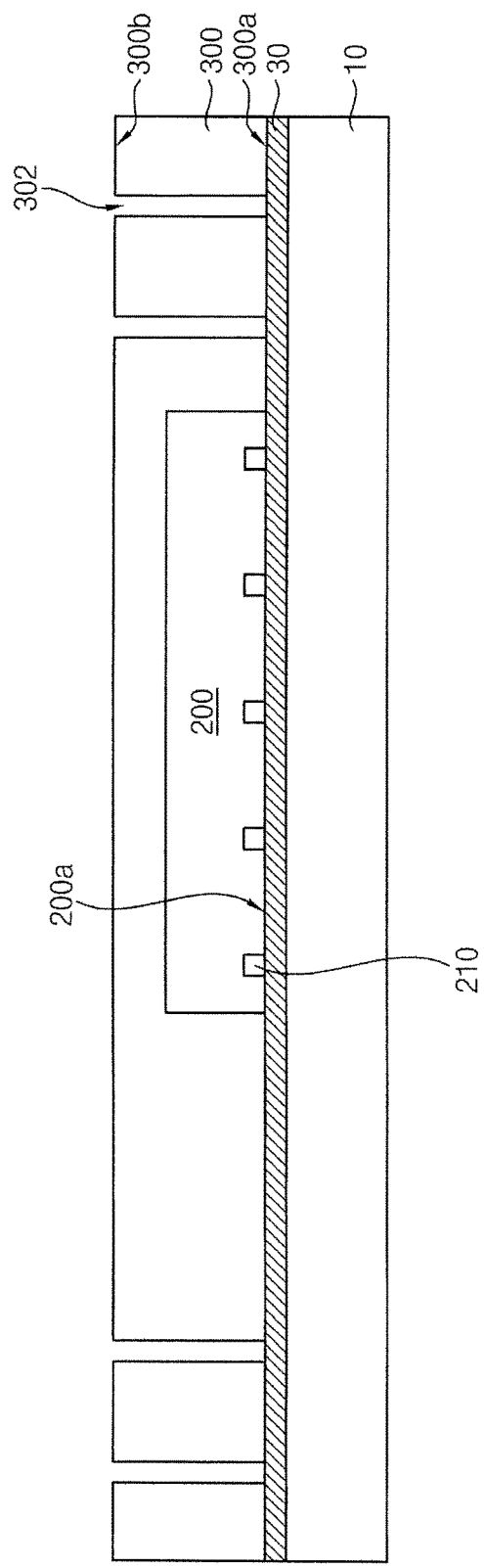
Figure 22:
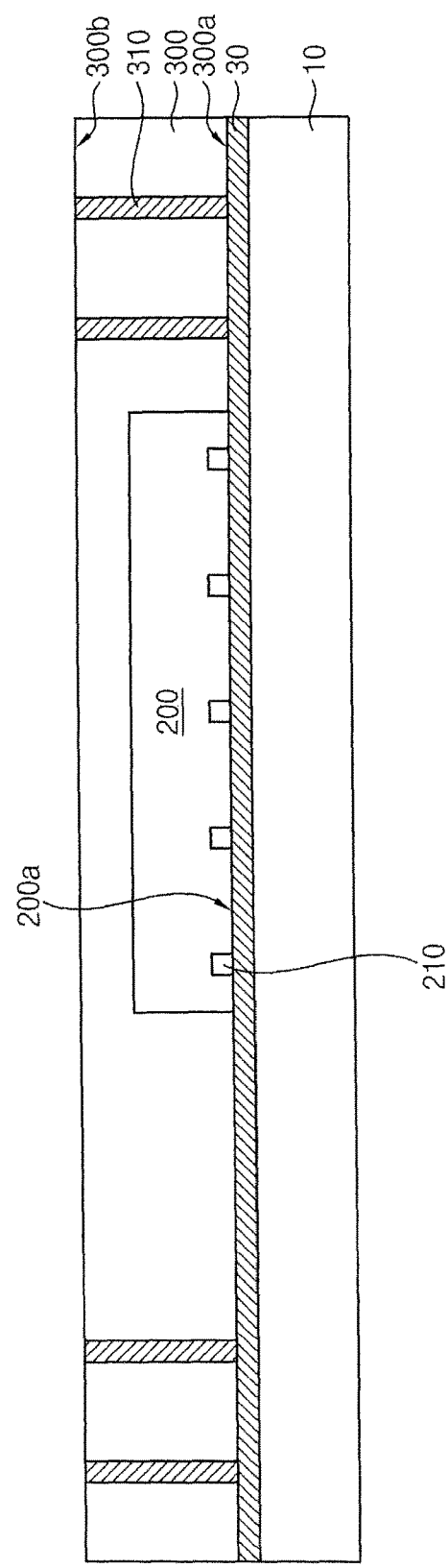

Referring to FIGS. 21 and 22, after forming sixth openings 302 in the mold substrate 300, exposing a portion of the conductive layer 30 on which the conductive connection pillars 310 are to be formed, the conductive connection pillars 310 may be formed in the sixth openings 302, respectively.

The sixth openings 302 may be formed by, for example, a laser drilling process. The conductive connection pillars 310 may be formed by performing a plating process on the portion of the conductive layer 30 exposed through the sixth openings 302.

Figure 23:
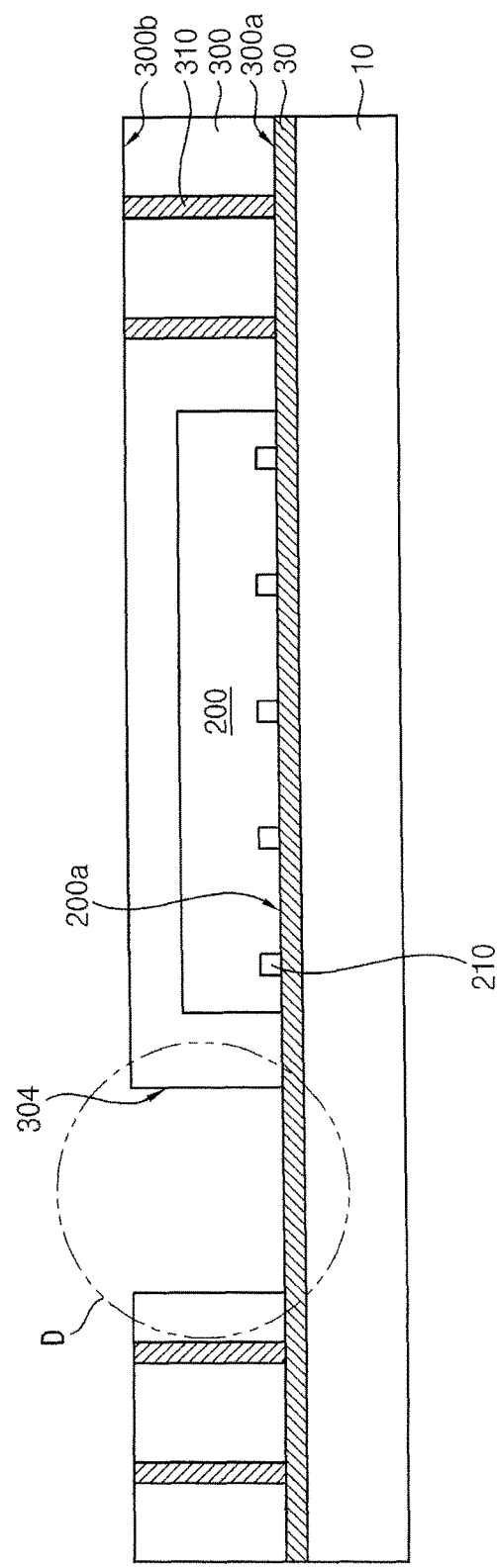
Figure 24:
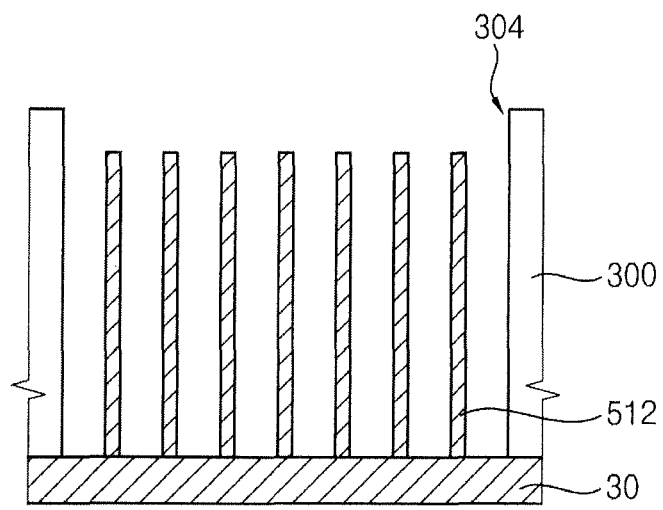

Referring to FIGS. 23 and 24, after forming a seventh opening 304 in the mold substrate 300 to expose another portion of the conductive layer 30, the conductive pillars 512 may be formed on the portion of the conductive layer 30 exposed through the seventh opening 304.

The seventh opening 304 may be formed by, for example, a drilling process.

In some embodiments, the conductive pillars 512 may be arranged in array on the conductive layer 30 and in the seventh opening 304. The conductive pillars 512 may form the first electrode of the capacitor 500 (refer to FIG. 30) along with the capacitor redistribution line 510 (refer to FIG. 30) to be formed in a subsequent process.

The conductive pillars 512 may include, for example, carbon nanofibers (CNFs) that are formed by a carbon nanofiber growth process. The conductive pillars 512 may extend from the exposed surface of the conductive layer 30 in a vertical direction relative to the first surface 300a of the mold substrate 300. The conductive pillars 512 may each have a length of about 0.1 μm to about 100 μm and a diameter of about 20 nm to 100 nm.

Figure 27:
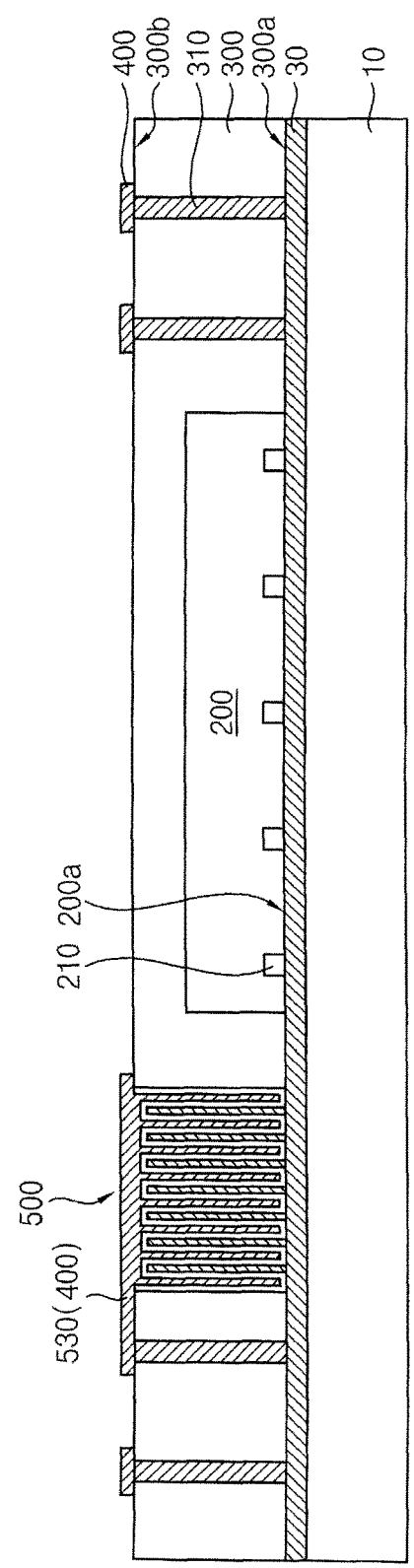

Referring to FIGS. 25 to 27, the dielectric layer 520 may be conformally formed on upper and side surfaces of the conductive pillars 512, and then, the second electrode 530 may be formed on the dielectric layer 520 in the seventh opening 304.

The backside redistribution lines 400 including the second electrode 530 may be formed on the second surface 300b of the mold substrate 300.

In some embodiments, the dielectric layer 520 may be formed on the conductive layer 30 in the seventh opening 304 to cover the conductive pillars 512. The dielectric layer 520 may be formed by, for example, a plasma chemical vapor deposition process. The dielectric layer 520 may be formed by, for example, a fluorocarbon deposition process.

Thereafter, a seed layer may be formed on the second surface 300b of the mold substrate 300 and on the dielectric layer 520 in the seventh opening 304, and then, the seed layer may be patterned. An electrolytic plating process may be performed on the patterned seed layer to form the backside redistribution lines 400 including the second electrode 530. The backside redistribution lines 400 except for the second electrode 530 may be formed on the conductive connection pillars 310.

Referring to FIG. 26, the capacitor 500 may be formed on the conductive layer 30 exposed by the seventh opening 304. The capacitor 500 may include the first electrode including the conductive pillars 512 on the conductive layer 30, the dielectric layer 520 on the first electrode, and the second electrode 530 on the dielectric layer 520.

Figure 28:
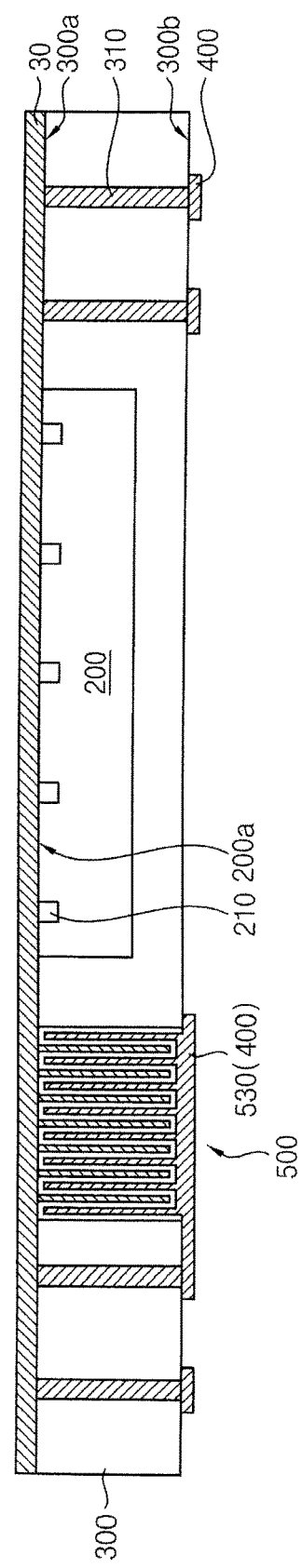
Figure 29:
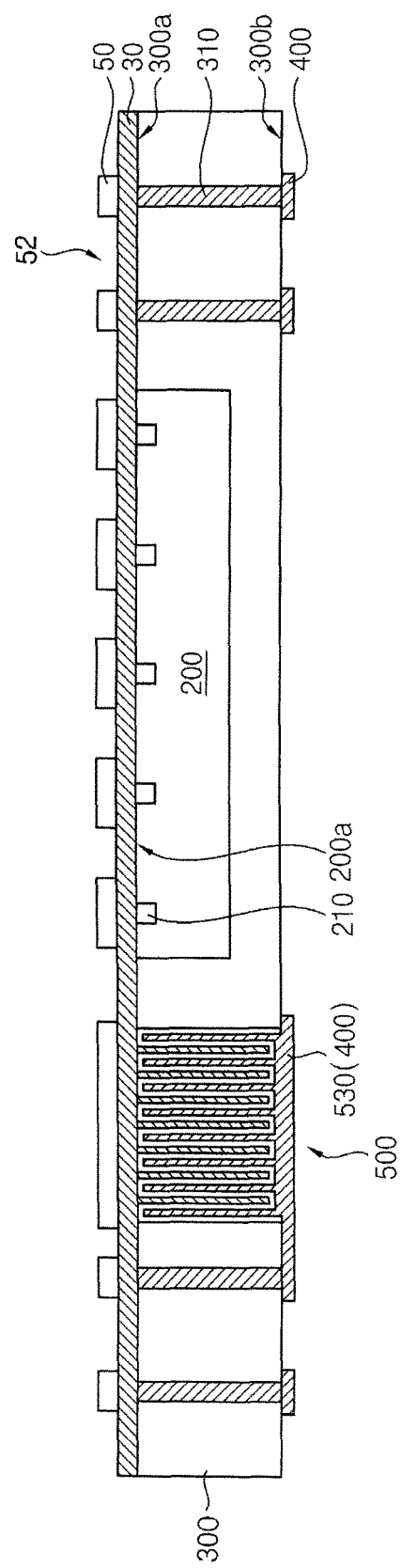
Figure 30:
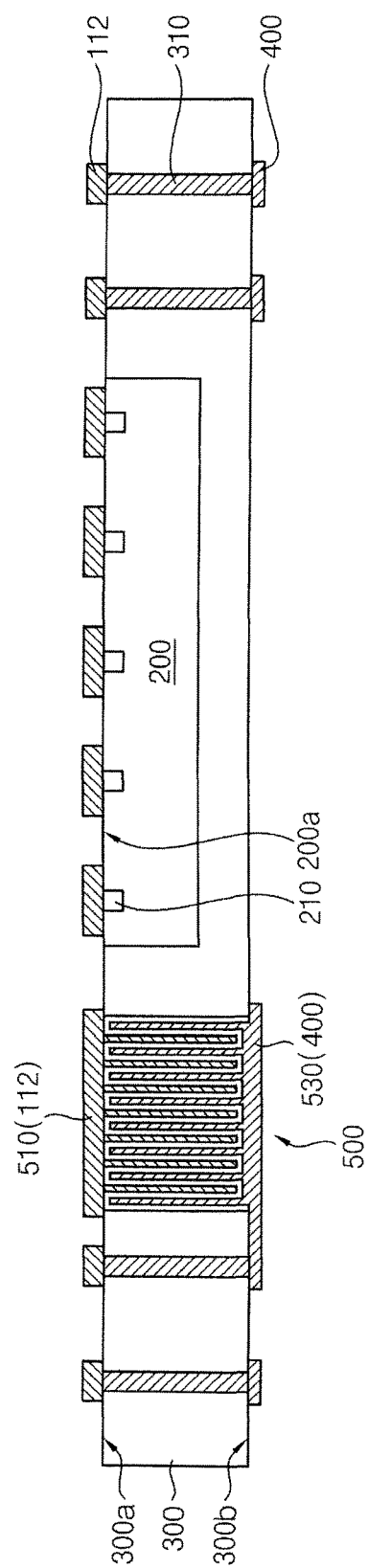

Referring to FIGS. 28 to 30, after inverting the structure of FIG. 27 that includes the mold substrate 300, a resist pattern 50 including eighth openings 52 may be formed on the conductive layer 30 to expose a portion of the conductive layer 30. The conductive layer 30 may be patterned using the resist pattern 50 to form the first redistribution lines 112 including the capacitor redistribution line 510.

For example, after forming a resist layer on the conductive layer 30, an exposure and development process may be performed to form the resist pattern 50. The portion of the conductive layer 30 exposed by the eighth openings 52 may be etched using the resist pattern 50 as an etch mask to form the first redistribution lines 112 including the capacitor redistribution line 510.

The first redistribution lines 112 may be formed on the chip pads 210 and the conductive connection pillars 310, respectively. The capacitor redistribution line 510 may be formed to be connected to the conductive pillars 512.

The capacitor 500 may be mounted in the mold substrate 300. The conductive pillars 512 of the capacitor 500 may be disposed in the mold substrate 300.

Figure 31:
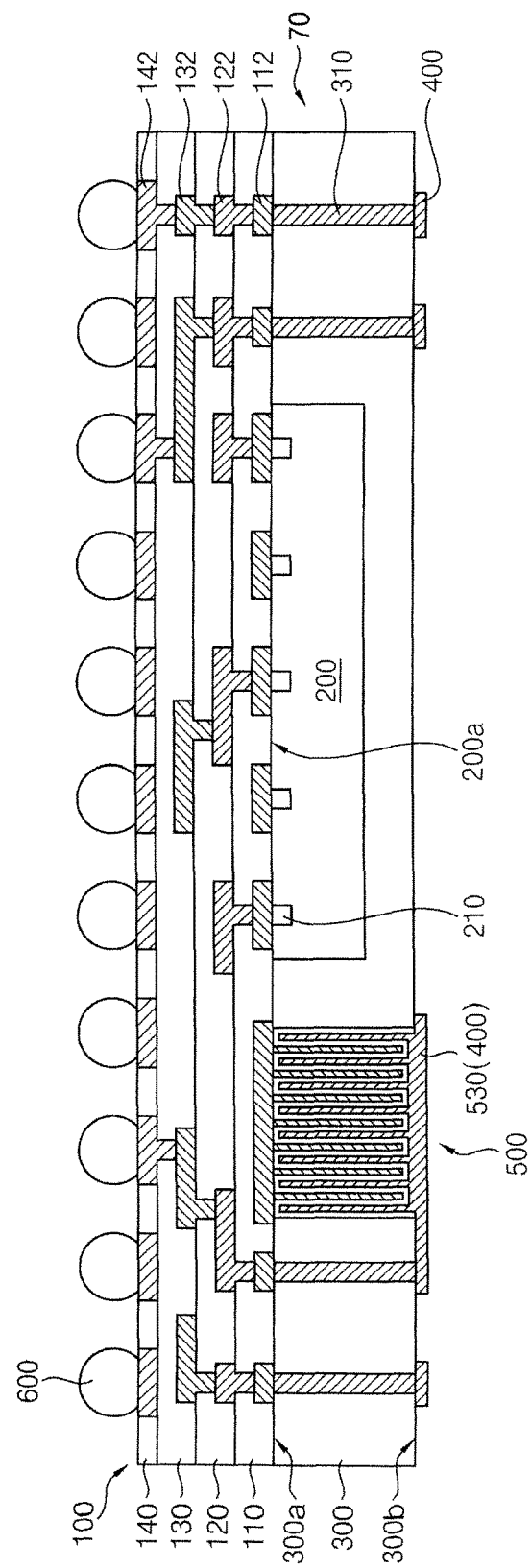

Referring to FIG. 31, after forming the redistribution layer 100 on the first surface 300a of the mold substrate 300, the outer connection terminals 600 may be formed on the redistribution layer 100.

In some embodiments, a sixth insulating layer 110 and the second redistribution lines 122 may be formed on the first redistribution lines 112 and on the first surface 300a of the mold substrate 300. The sixth insulating layer 110 may include openings exposing the first redistribution lines 112. The second redistribution lines 122 may be formed on the sixth insulating layer 110 to be connected to the first redistribution lines 112.

A seventh insulating layer 120 and the third redistribution lines 132 may be formed on the second redistribution lines 122 and the sixth insulating layer 110. The seventh insulating layer 120 may include openings exposing the second redistribution lines 122. The third redistribution lines 132 may be formed on the seventh insulating layer 120 to be connected to the second redistribution lines 122.

An eighth insulating layer 130 and the fourth redistribution lines 142 may be formed on the third redistribution lines 132 and the seventh insulating layer 120. The eighth insulating layer 130 may include openings exposing the third redistribution lines 132. The fourth redistribution lines 142 may be formed on the eighth insulating layer 130 to be connected to the third redistribution lines 132.

Therefore, the redistribution layer 100 including the first to fourth redistribution lines 112, 122, 132, and 142 that are electrically connected to the chip pads 210 on the first surface 200a of the first semiconductor chip 200 may be formed. The number and arrangement of the insulating layers and the redistribution lines of the redistribution layer 100 are not limited thereto, but may be varied.

Thereafter, the outer connection terminals 600 may be formed on the redistribution layer 100 to be connected to the redistribution layer 100. For example, solder balls may each be formed on a portion of each of the fourth redistribution lines 142 to form the outer connection terminals 600. In this case, the portion of each of the fourth redistribution lines 142 may be used as a landing pad (e.g., a package pad). Accordingly, the redistribution layer 100 including fan-out type solder ball landing pads may be formed by performing a semiconductor fabrication process on the mold substrate 300 having the same size as each die of a wafer.

Thereafter, the mold substrate 300 may be separately formed through a sawing process, such that the first package 70 including the mold substrate 300, the first semiconductor chip 200 in the mold substrate 300, and the redistribution layer 100 on the mold substrate 300 may be formed.

Figure 32:
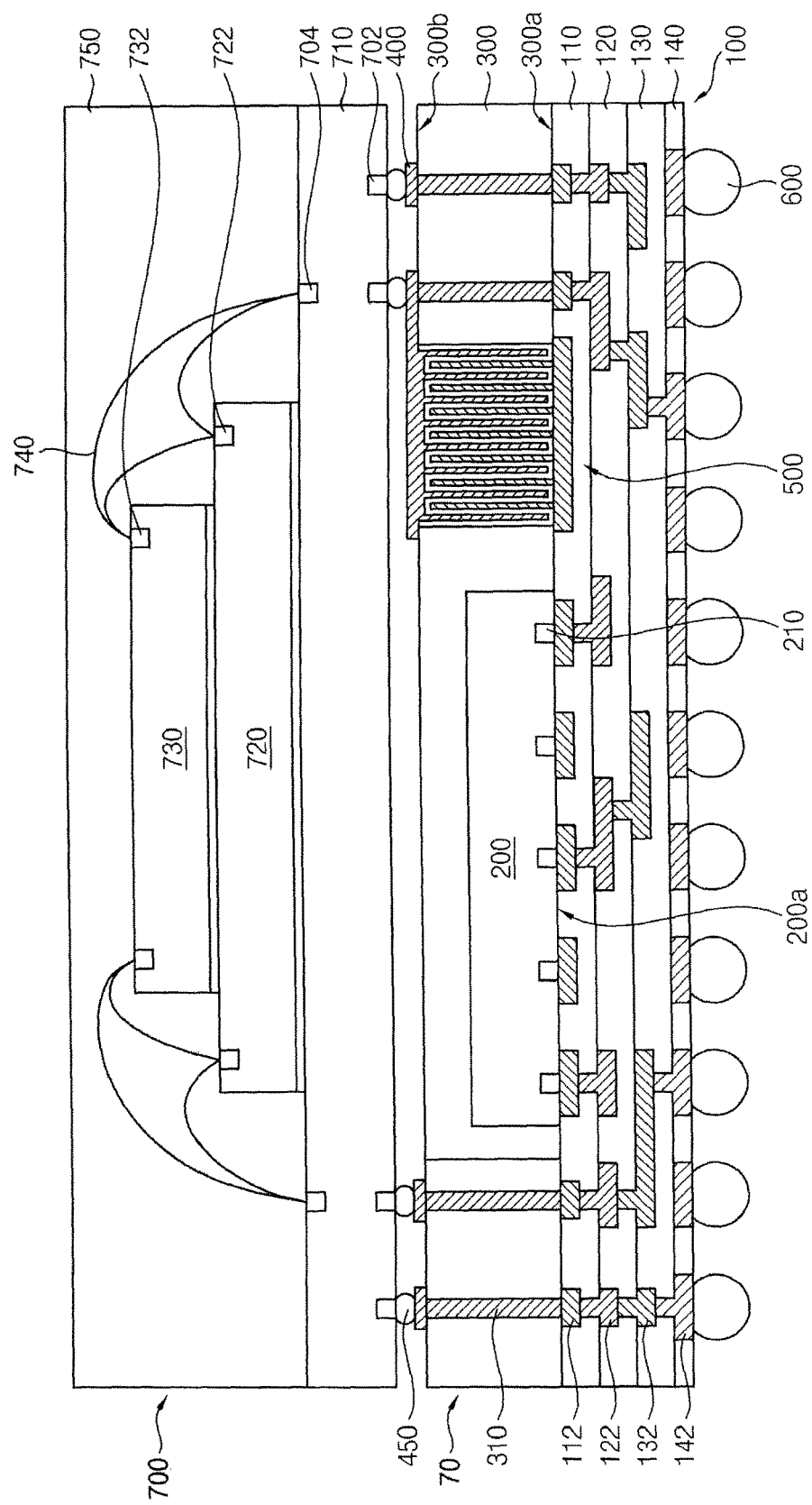

Referring to FIG. 32, the second package 700 may be stacked on the first package 70.

In some embodiments, the second package 700 may include the second package substrate 710, the second and third semiconductor chips 720 and 730 mounted on the second package substrate 710, and the molding member 750 on the second package substrate 710 to cover the second and third semiconductor chips 720 and 730.

The second package 700 may be stacked on the second surface 300b of the mold substrate 300 using the conductive connection members 450. For example, the conductive connection members 450 may each include a solder ball or a conductive bump. The conductive connection members 450 may each be disposed between each of the backside redistribution lines 400 on each of the conductive connection pillars 310 and each of the first connection pads 702 of the second package substrate 710. Thus, the first package 70 and the second package 700 may be electrically connected by the conductive connection members 450.

The second and third semiconductor chips 720 and 730 may be stacked on the second package substrate 710 by adhesives. The bonding wires 740 may connect the chip pads 722 and 732 of the second and third semiconductor chips 720 and 730 to the second connection pads 704 of the second package substrate 710, such that the second and third semiconductor chips 720 and 730 may be electrically connected to the second package substrate 710.

Although the second package 700 includes two semiconductor chips mounted by a wire-bonding method, the number and the mounting method of the semiconductor chips in the second package 700 are not limited thereto.

The semiconductor package 2 including the first package 70 and the second package 700 may be formed. The semiconductor package 2 may include a logic device, such as a central processing unit (CPU), a microprocessor unit (MPU), or an application unit (AP), and a nonvolatile memory device, such as a flash memory, PRAM, MRAM, or ReRAM, and a volatile memory device, such as SRAM or DRAM.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A semiconductor package comprising:
   a mold substrate having opposite first and second surfaces;
   a semiconductor chip embedded inside the mold substrate, the semiconductor chip including chip pads;
   a redistribution layer on the first surface of the mold substrate, the redistribution layer including redistribution lines therein electrically connected to the chip pads and including a capacitor redistribution line; and
   a capacitor comprising:
      a first electrode including a plurality of conductive pillars connected to the capacitor redistribution line;
      a dielectric layer on the first electrode; and
      a second electrode on the dielectric layer;
   wherein the redistribution lines include a first conductive material, and
   the plurality of conductive pillars include a second conductive material different from the first conductive material.

2. The semiconductor package according to claim 1, wherein the conductive pillars are arranged in an array on the capacitor redistribution line.

3. The semiconductor package according to claim 1, wherein the plurality of conductive pillars extend from the capacitor redistribution line in a vertical direction that is defined from the first surface of the mold substrate to the second surface of the mold substrate.

4. The semiconductor package according to claim 1, wherein the plurality of conductive pillars comprise a plurality of respective carbon nanofiber pillars.

5. The semiconductor package according to claim 1, wherein the redistribution layer includes a first layer and a second layer on the first layer;
   wherein the first layer includes first redistribution lines;
   wherein the second layer includes second redistribution lines; and
   wherein the plurality of conductive pillars are between the first layer and the second layer.

6. The semiconductor package according to claim 5, wherein the capacitor redistribution line is in the first layer, and the second electrode is in the second layer.

7. The semiconductor package according to claim 1, wherein the capacitor redistribution line is spaced apart from the semiconductor chip and is outside the mold substrate.

8. The semiconductor package according to claim 1, wherein the plurality of conductive pillars are disposed in the mold substrate.

9. The semiconductor package according to claim 8, wherein the capacitor redistribution line is disposed on the first surface of the mold substrate; and
   wherein the second electrode is disposed on the second surface of the mold substrate.

10. The semiconductor package according to claim 9 wherein the plurality of conductive pillars are arranged in at least two contiguous two dimensional arrays having different dimensions from one another.

11. A semiconductor package comprising:
    redistribution lines including a capacitor redistribution line therein;
    a semiconductor chip including chip pads thereon electrically connected to the redistribution lines; and
    a capacitor including:
       a first electrode including a plurality of conductive pillars connected to the capacitor redistribution line, the plurality of conductive pillars buried in the redistribution lines beneath the semiconductor chip;
       a dielectric layer on the first electrode; and
       a second electrode on the dielectric layer;
    wherein the capacitor redistribution line includes a first conductive material, and
       the plurality of conductive pillars include a second conductive material different from the first conductive material.

12. The semiconductor package according to claim 11, wherein the plurality of conductive pillars comprise a plurality of respective carbon nanofiber pillars.

13. The semiconductor package according to claim 11, wherein the redistribution lines include a first layer and a second layer on the first layer;
    wherein the first layer includes first redistribution lines;
    wherein the second layer includes second redistribution lines; and
    wherein the plurality of conductive pillars are between the first layer and the second layer.

14. The semiconductor package according to claim 11, further comprising a mold substrate on the redistribution lines and covering the semiconductor chip.

* * * * *